United States Patent
Arai et al.

[11] Patent Number: 6,072,185
[45] Date of Patent: Jun. 6, 2000

[54] CHARGED-PARTICLE-BEAM EXPOSURE DEVICE AND METHOD CAPABLE OF HIGH-SPEED DATA READING

[75] Inventors: Soichiro Arai; Kenichi Miyazawa; Hidefumi Yabara; Hiroshi Yasuda, all of Kawasaki, Japan

[73] Assignee: Fujitsu Limited, Kawasaki, Japan

[21] Appl. No.: 08/971,917

[22] Filed: Nov. 18, 1997

Related U.S. Application Data

[63] Continuation of application No. 08/680,962, Jul. 16, 1996, abandoned.

[30] Foreign Application Priority Data

Dec. 28, 1995 [JP] Japan .................................. 7-343929

[51] Int. Cl.$^7$ ................................................ H01J 37/304
[52] U.S. Cl. ............................... 250/492.22; 250/492.2
[58] Field of Search ....................... 250/398, 492.2, 250/492.22

[56] References Cited

U.S. PATENT DOCUMENTS

| | | | |
|---|---|---|---|
| 4,433,384 | 2/1984 | Berrian et al. | 250/492.2 |
| 4,837,447 | 6/1989 | Pierce et al. | 250/398 |
| 5,430,304 | 7/1995 | Yasuda et al. | 250/396 R |
| 5,444,257 | 8/1995 | Satoh et al. | 250/398 |
| 5,448,075 | 9/1995 | Fueki et al. | 250/398 |
| 5,528,048 | 6/1996 | Oae et al. | 250/492.22 |
| 5,614,725 | 3/1997 | Oae et al. | 250/492.2 |

*Primary Examiner*—Bruce C. Anderson
*Attorney, Agent, or Firm*—Staas & Halsey LLP

[57] ABSTRACT

A device exposing a wafer to charged-particle beams in an exposure process generates a plurality of micro beams and controls deflection of each of the micro beams, relative to whether or not the micro beams reach the wafer, in accordance with control data. A data processing unit inserts data-position-adjustment data into the control data for each exposure. A first data-storage unit stores the control data, inserted with the data-position-adjustment data, and outputs the control data at a time of the exposure process. Storage positions of the control data in the first data-storage unit are adjusted by the data-position-adjustment data so that the control data can be continuously read from the first data-storage unit for maintaining a continuous exposure process.

20 Claims, 12 Drawing Sheets

CHARGED-PARTICLE-BEAM EXPOSURE DEVICE AND METHOD CAPABLE OF HIGH-SPEED DATA READING

This application is a continuation of application Ser. No. 08/680,962, filed Jul. 16, 1996, now abandoned.

BACKGROUND OF THE INVENTION

1. Field of the Invention

The present invention generally relates to charged-particle-beam exposure devices and methods for using such devices, and particularly relates to a charged-particle-beam exposure device and a charged-particle-beam exposure method of a multi-beam-blanking-aperture-array type having a plurality of rectangular apertures and electrodes arranged in proximities thereof for deflecting a plurality of beams.

Integrated circuits (IC), with recent developments in functions and circuit density, have been playing an important role as a core technology for technological development in industrial fields such as computers, telecommunications, mechanical control, etc. Circuit density of ICs has been on a rapid increase, quadrupling every two to three years. Such a rapid increase in the circuit density is achieved based on developments in micro-process technology.

2. Description of the Related Art

A block exposure method and a blanking-apperture-array (BAA) exposure method, which have been recently proposed as micro-process technology, can achieve as high a throughput as 1 cm²/sec. These two methods are known to be superior compared to other micro-process technology in terms of the fineness of the process, the exposure positioning accuracy, the turn-around speed, and reliability.

FIG. 1 is an illustrative drawing showing a blanking aperture array used in a BAA exposure device. The blanking aperture array includes a plurality of rectangular apertures and electrodes arranged in proximities of the apertures for deflecting beams. Voltage is separately applied to each of the electrodes via wiring to individually control the deflection of a charged-particle beam passing through a corresponding aperture. The charged-particle beam deflected by the voltage applied to the electrode can be blanked by a diaphragm located downstream with respect to the beam flow, so that a micro beam can be switched, between on and off states on an exposed wafer. At the time of an exposure process, all apertures as shown in FIG. 1 are exposed to a charged-particle beam, and a number of micro beams passing through the apertures are directed to the wafer. By applying appropriate voltages to the electrodes, the micro beams can be switched between on and off states, selectively and thus independently of each other.

A charged-particle-beam exposure device includes a first deflector (main deflector: electromagnetic deflector) for deflecting a charged-particle beam by a large magnitude, and a second deflector (sub-deflector: static-charge deflector) for deflecting the charged-particle beam by a fine magnitude. A set of the micro beams exposed onto the wafer, while being switched between on and off states, are deflected by the second deflector to draw a required pattern on the wafer. At the same time, the wafer is moved in a certain direction (X direction) by a wafer stage. The pattern is drawn by deflecting and scanning the set of the micro beams in the Y direction faster than the movement of the wafer stage in the X-direction.

FIG. 2 is an illustrative drawing showing an exposure area for pattern drawing. As shown in the figure, an area having a 2-mm width is divided into 100-$\mu$m square areas. Each of the 100-$\mu$m square areas is further divided into 10-$\mu$m-by-100-$\mu$m stripe areas, which are called cell stripes. An interior of a cell stripe is drawn by the set of the micro beams scanned in the Y direction as described above. After finishing the drawing in a given cell stripe, the set of the micro beams is deflected in an X direction to an adjacent cell stripe by the second deflector and, then, an interior of the latter cell stripe is drawn by the Y-direction scanning.

An area size covered by the second-deflector deflection is about 100 $\mu$m in the X direction. After finishing the drawing in a given 100-$\mu$m square area, the set of the micro beams is shifted to an adjacent 100-$\mu$m square area. Then, the drawing on the wafer continues in the same manner.

In the example of FIG. 1, the apertures are arranged in 8 lines including a first line A, a second line B, a third line C, . . . , and an eighth line H. Each line is comprised of two sub-lines. For example, the line A is comprised of a sub-line A1 and a sub-line A2. In order to draw a pattern without any pattern gaps, the apertures in one sub-line are staggered with the apertures in the other sub-line to fill the pattern gaps. Thus, in principle, two sub-lines constitute one line. Each line includes 64 apertures.

The lines A through H are divided into four sets $K_1$ through $K_4$, with two adjacent lines forming a respective set. Among the two lines in a given set (e.g., the line A and the line B in the set $K_1$), apertures in the first line (e.g., the line A) allow passage of micro beams directed to given positions on the wafer, and, then, apertures in the second line (e.g., the line B) allow passages of micro beams scanned in the Y direction to be exposed to the same positions on the wafer. In this manner, the two lines in the same set are used for exposing the micro beams to the same positions on the wafer to ensure reliable drawing.

The four sets $K_1$ through $K_4$ are staggered in the X direction and in the Y direction with each other, so that the micro beams of these sets are superimposed by half the beam size on the wafer. FIG. 3 is an illustrative drawing showing the superimposition of the micro beams. As shown in FIG. 3, each micro beam is arranged at intervals of half the beam size (i.e., high pitch), so that a fine adjustment of the pattern-edge drawing, a closing-effect correction, etc., can be carried out at a higher precision than the beam size itself.

FIG. 4 is a block diagram of a BAA exposure system. In FIG. 4, the charged-particle-beam exposure device includes an exposure-column unit and a control unit. The exposure-column unit includes a charged-particle-beam generator 200, a lens 201 for converging the charged-particle beam, a BAA 202, a blanking aperture 203 for blanking or passing the beams according to a blanking signal, a round aperture 204 for blanking the beams, a lens 205 for converging the beams, a refocus coil 206 for correcting an increase in the beam focus distance, a dynamic-stigmator coil 207, a dynamic-focus coil 208, and a main deflector 209 and a sub-deflector 210 for positioning the beams on the wafer. The exposure-column unit further includes a stage 211 movable in the X and Y directions for carrying the wafer.

The control unit includes a CPU 100 responsible for control of the entire system of the charged-particle-beam device. The control unit further includes an SEM/MD-control unit 101 responsible for control at the time of the mark detection and SEM, an exposure-management unit 102, a BAA-management unit 103, a shooting memory 105 for storing BAA data, a refocus memory 108 for storing refocus data, a main-deflector-deflection-amount setting unit 109, a sub-deflector-deflection-amount setting unit 112, and a stage controlling unit 113, all of which are connected with each other and with the CPU 100 via a data bus such as the VME bus. The control unit further includes a conversion/amplification unit 106 for applying parallel-to-serial conversion and amplification to the data from the shooting memory 105, a stigmator-coil driving unit 110, a refocus-coil driving unit 111, and a loader-management unit 114.

The CPU 100 is connected with a data-management CPU 120 for data management. The data-management CPU 120 is connected via a data bus with a disk 121 for storing pattern data, a data-expansion unit 122 for expanding the pattern data into bit-map data, a bit-map-data disk 104 for storing the bit-map data, and a refocus-data disk 107 for storing refocus data. The refocus data is used for correcting an increase in the beam focus distance, and is generated by the data-expansion unit 122.

In FIG. 4, the pattern data generated from design data is supplied from the disk 121 to the data-expansion unit 122, which expands the supplied data into the bit-map data. The bit-map data is stored in the bit-map-data disk 104 for each cell stripe or for each set of cell stripes. Also, the refocus data is generated from the bit-map data, and is stored in the refocus-data disk 107.

The data-expansion process described above is carried out prior to the exposure process, so that the data-expansion process does not impose any restriction on the speed of the exposure-process. Also, once the data is expanded, another data-expansion process is no longer necessary and the same expanded data can be used, as long as the same pattern is to be exposed.

The bit-map data is transferred from the bitmap-data disk 104 to the shooting memory (high-through-put buffer) 105. The shooting memory 105 has a capacity to store data for two 20-mm square chips. When the chip size to be exposed in smaller than a 20-mm square, the shooting memory 105 can be divided into two, with one used for data output and the other used for data storage. In this manner, the data storage and the data output can be simultaneously carried out. That is, while a given chip is exposed, data for the next chip can be stored. When the chip size to be exposed is larger than a 20-mm square, either the data storage or the data output is carried out exclusively.

The data from the shooting memory 105 is supplied to the conversion/amplification unit 106. The conversion/amplification unit 106 applies the parallel-to-serial conversion to the supplied data and manages the timing control, and, also, amplifies the data to supply it to the BAA 202.

At the time of the exposure, the main-deflector-deflection-amount setting unit 109 and the sub-deflector-deflection-amount setting unit 112 define the deflection amounts of the main deflector 209 and the sub-deflector 210, respectively, and the sub-deflector 210 starts the scan. At the same time, a signal indicating a start of a cell-stripe exposure is supplied to the BAA-management unit 103. In response, data defining on/off states of each micro beam for one cell stripe is supplied to the BAA 202 under the control of the BAA-management unit 103.

The BAA-type exposure device described above can be used for exposing any of various types of patterns without sacrificing the throughput or production. Since it requires a large amount of data at the time of exposure, however, a high-speed data output becomes necessary in order to draw fine patterns at high throughput or production levels. As described above, in the related-art device and the method, the data is supplied to the BAA 202 in the following procedure.

1. The pattern data is expanded by the data-expansion unit 122 to generate the bit-map data and store it in the bit-map-data disk 104.

2. The required exposure data is transferred from the bit-map-data disk 104 to the shooting memory 105.

3. The data is output in parallel from the shooting memory 105 at the time of exposure.

4. The output data is subjected to processing by parallel-to-serial conversion unit and amplification unit 106, and then is supplied to the BAA 202.

The shooting memory 105 requires a large capacity, and, thus, needs to be comprised of a DRAM. Since the memory data length is 16 bits, a data serial output is only 160 MHz at a maximum, even when the data is output at 100 nsec intervals. Thus, even if other units have sufficient capacity for a high-speed exposure process, production is restricted by the serial output of 160 MHz. This cap on production cannot be exceeded.

In order to obviate this problem, the high-speed page mode of the DRAM may be used to boost the memory access speed. Different from a normal mode requiring successive inputs of row addresses and column addresses, the high-speed page mode allows continuous inputs of column addresses for one row-address input to achieve a high-speed-data-read operation. Therefore, use of this high-speed page mode in the shooting memory 105 should achieve a high-speed-data-read operation to boost production.

However, column addresses in the memory are comprised of 256 addresses, for example, so that continuous data reading can be made only for 256 addresses. If the column address to be read exceeds a 256th address, a page-hit error is generated, stopping the data-read operation. Namely, data for only 256 addresses can be subjected to the continuous data reading, and the data-read operation is temporarily stopped when a next row address is accessed after accesses to the 256 column addresses.

If such a temporal stoppage of the data-read operation occurs during a cell-stripe exposure, the exposure process is forced to stop, impairing the cell-stripe exposure.

Accordingly, there is a problem in the BAA-type charged-particle-beam exposure device and method in that the data-read operation is forced to stop, impairing the exposure process when the high-speed-data-read operation is used for boosting production.

Accordingly, there is a need for a BAA-type charged-particle-beam exposure device and a method therefor which can read out data without impairing the exposure process when the high-speed-data-read operation is used for boosting the throughput.

SUMMARY OF THE INVENTION

Accordingly, it is a general object of the present invention to provide a BAA-type charged-particle-beam exposure device and a method therefor which can satisfy the need described above.

It is another and more specific object of the present invention to provide a BAA-type charged-particle-beam exposure device and a method therefor which can read out data without impairing the exposure process when the high-speed-data-read operation is used for boosting production.

In order to achieve the above objects according to the present invention, a device for exposing a wafer to charged-particle beams in an exposure process by generating a plurality of micro beams and controlling deflection of each of the micro beams as to whether or not to let the micro beams reach the wafer includes a data processing unit for inserting data-position-adjustment data into control data for controlling the deflection, and a first data-storage unit for storing the control data inserted with the data-position-adjustment data and for outputting the control data at a time of the exposure process. In this device, storage positions of the control data in the first data-storage unit are adjusted by the data-position-adjustment data so that the control data can be continuously read from the first data-storage unit for continuation of the exposure process.

The same object can be achieved by a method of exposing a wafer to charged-particle beams in an exposure process by generating a plurality of micro beams and controlling deflection of each of the micro beams as to whether or not to let the micro beams reach the wafer. The method includes the steps of inserting data-position-adjustment data into control data for controlling the deflection, storing the control data inserted with the data-position-adjustment data in a first memory, and reading the control data from the first memory at a time of the exposure process, wherein storage positions of the control data in the first memory are adjusted by the data-position-adjustment data so that the control data can be continuously read from the first memory for continuation of the exposure process.

In the device and the method described above, when the control data for the deflection of the micro beams passing through apertures of the BAA is stored in the high-speed storage device (first data-storage unit), the data-position-adjustment data (nil data) is inserted into the control data at appropriate positions. Therefore, data for each cell stripe is read from the high-speed storage device without a break in the high-speed page mode.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1:
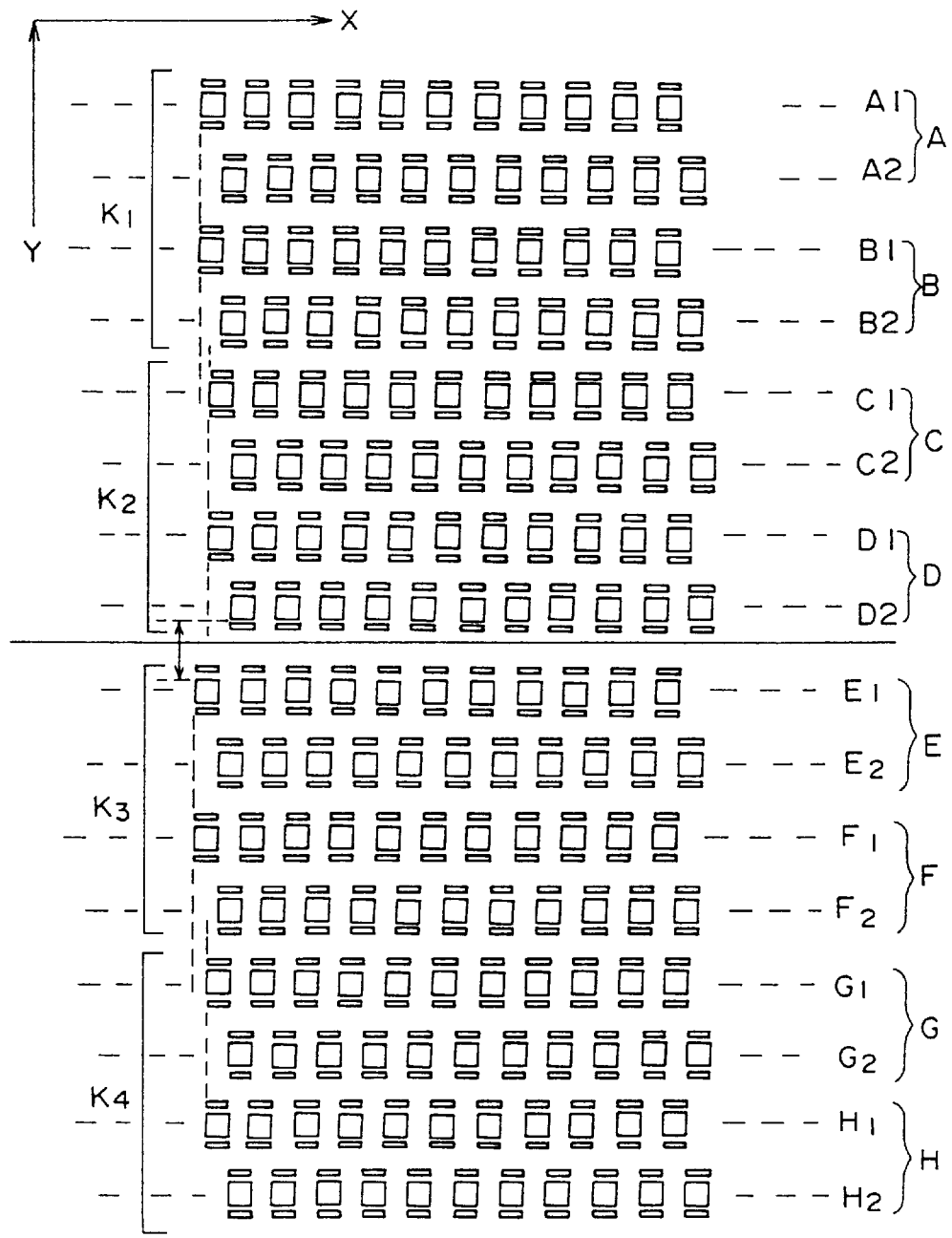
FIG. 1 is an illustrative drawing showing a blanking aperture array used in a BAA exposure device of the related art.
Figure 2:
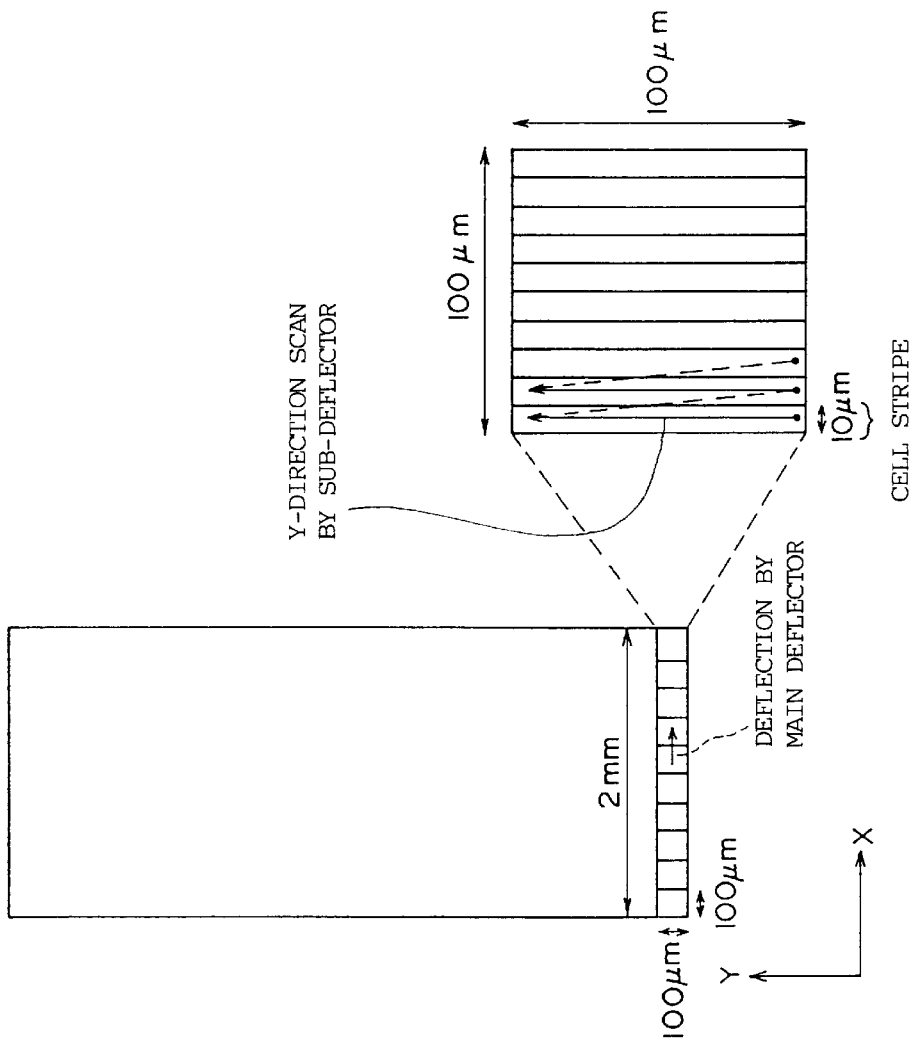
FIG. 2 is an illustrative drawing showing an exposure area for pattern drawing.
Figure 3:
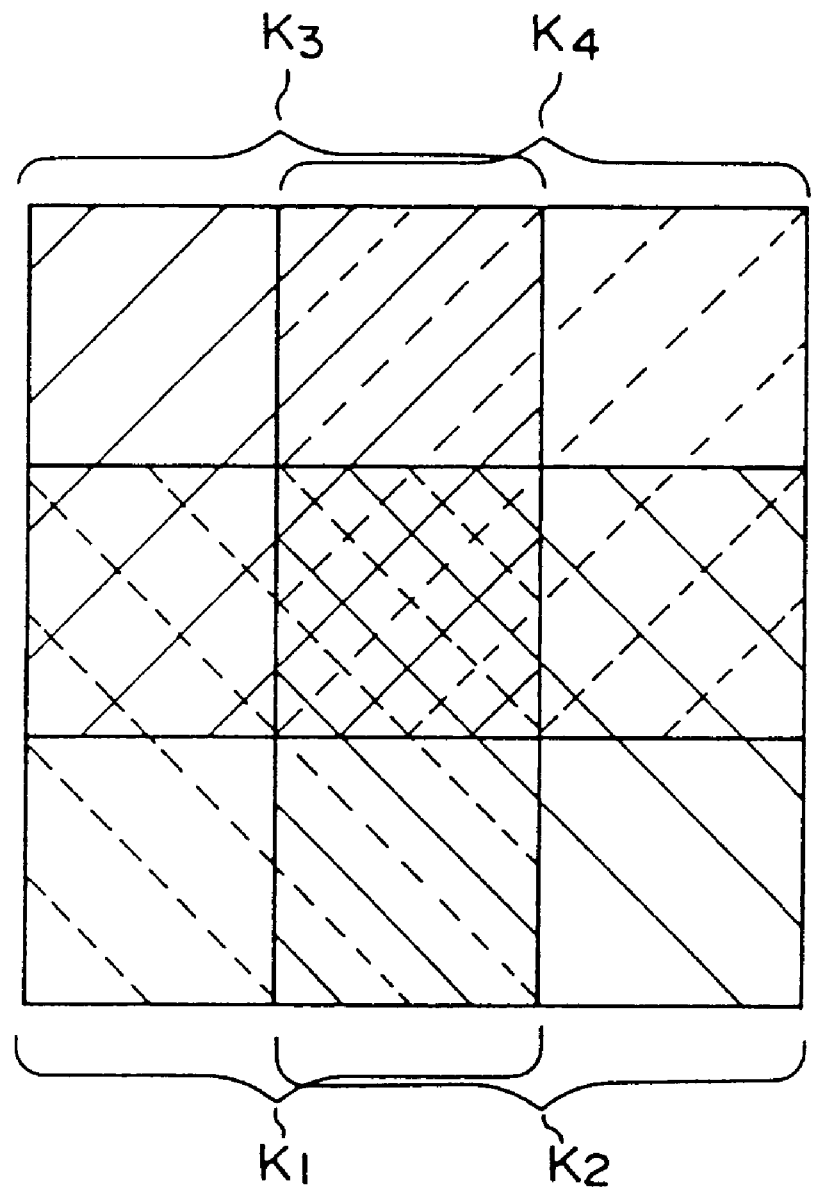
FIG. 3 is an illustrative drawing showing superimposition of micro beams.
Figure 4:
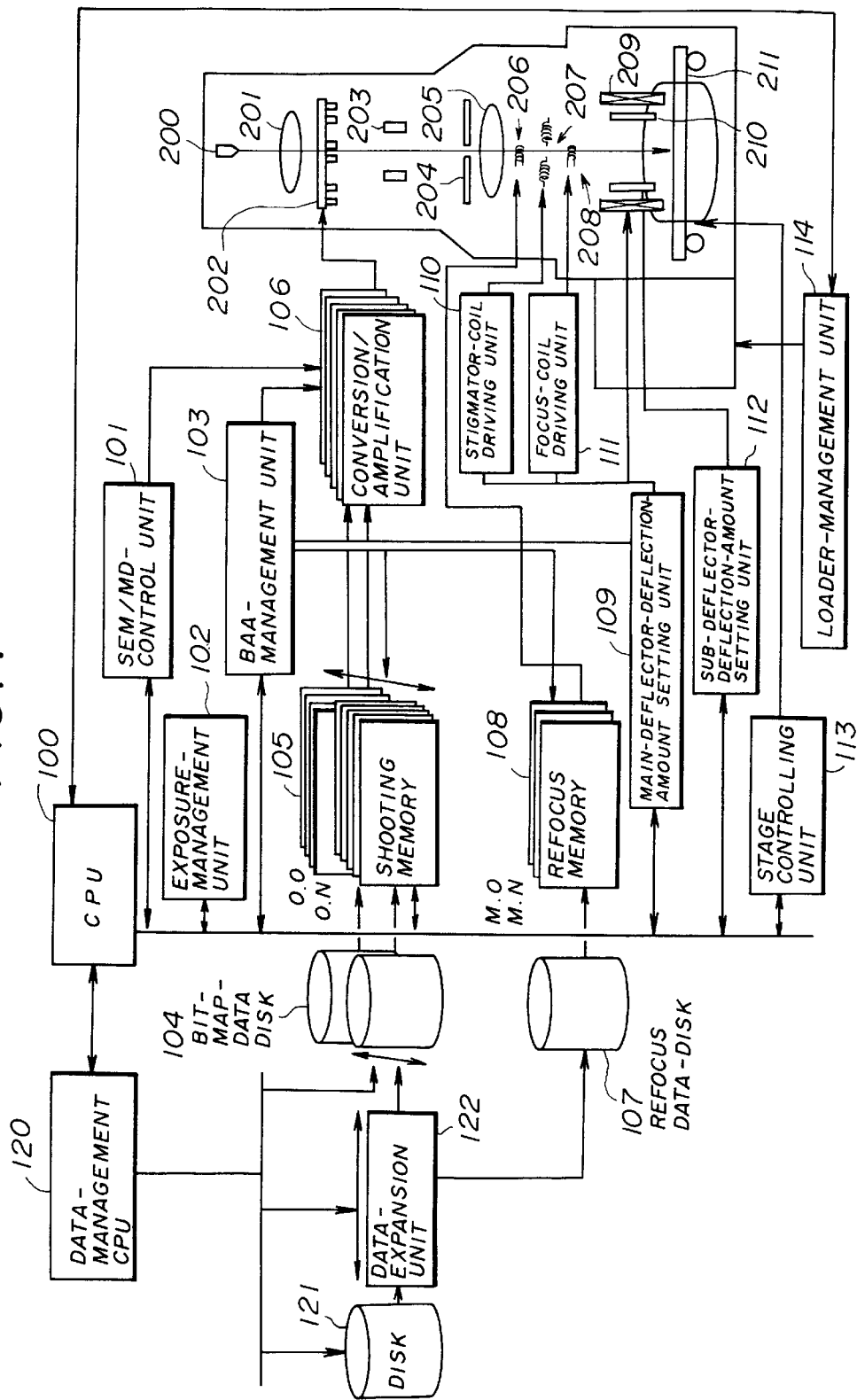
FIG. 4 is a block diagram of a BAA exposure system of the related art.
Figure 5:
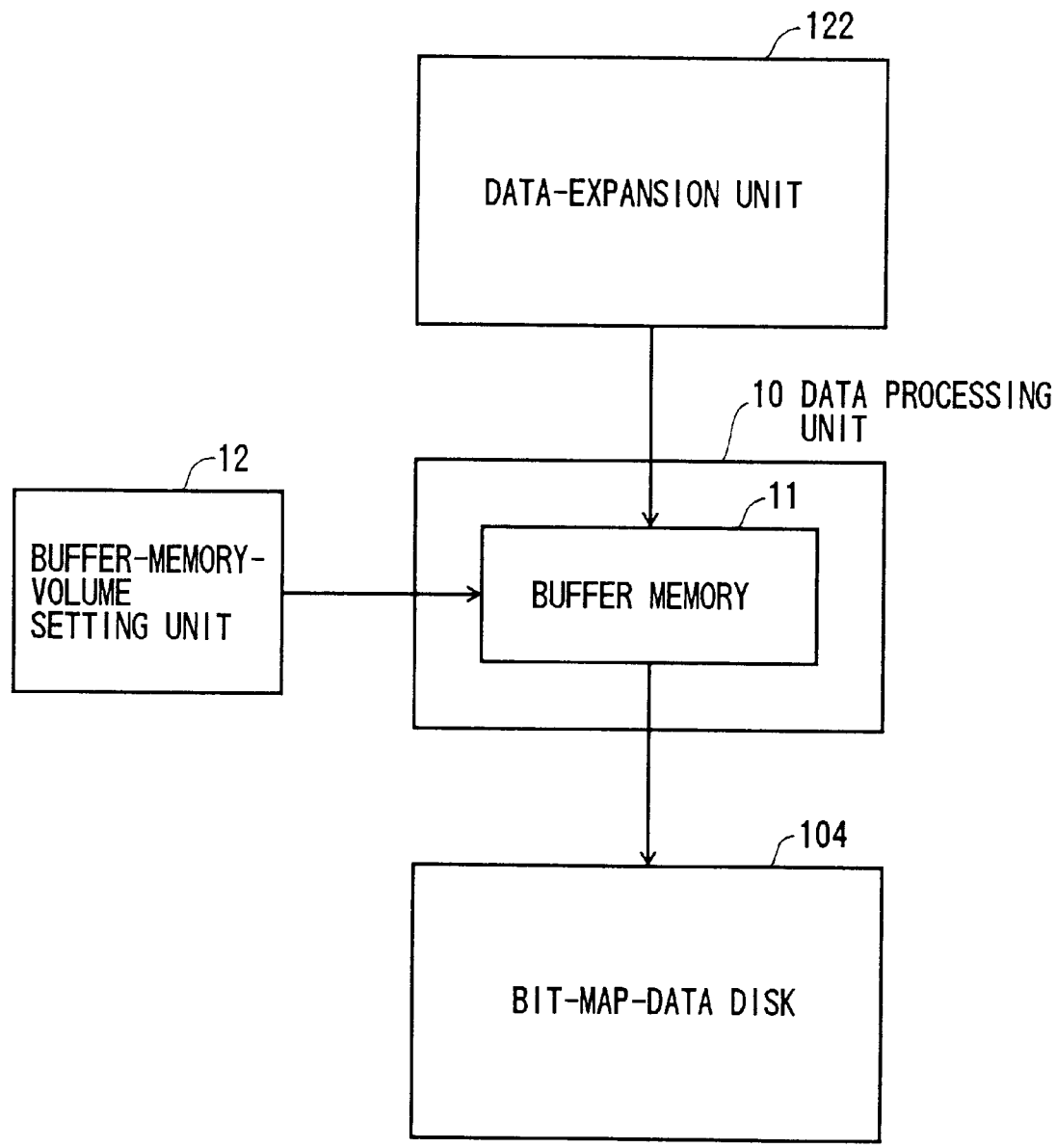
FIG. 5 is a bock diagram showing a data processing unit according to a first embodiment of the present invention.

FIG. 5 is a bock diagram showing a data processing unit 10 according to a first embodiment of the present invention. As shown in the figure, the data processing unit 10 is provided between the data-expansion unit 122 and the bit-map-data disk 104 of FIG. 4.

The data processing unit 10 inserts nil data at appropriate positions into the bit-map data, expanded by the data-expansion unit 122, and stores the processed bit-map data in the bit-map-data disk 104. The processed bit-map data is continuously read from the bit-map-data disk 104 to be stored in the shooting memory 105. Since the processed bit-map data is inserted with the nil data (data-position-adjustment data) at appropriate positions, data storage of a given cell stripe across a border between 256-address areas of the memory, i.e., across the border hindering the continuous read operation of the page mode, is avoided.

Figure 6:
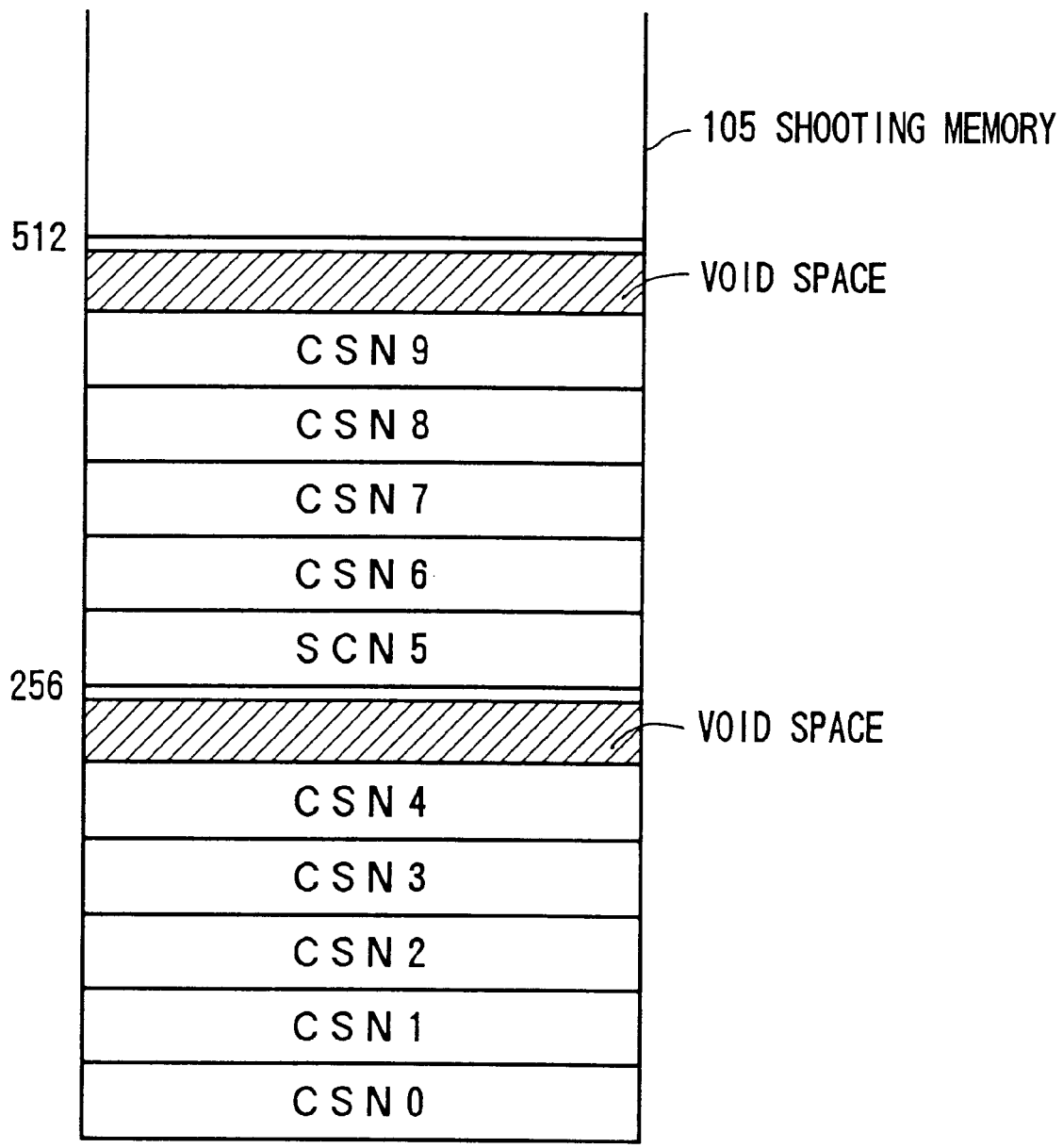
FIG. 6 is an illustrative drawing showing processed bit-map data stored in the shooting memory of FIG. 5.

FIG. 6 is an illustrative drawing showing the processed bit-map data stored in the shooting memory 105. As shown in the figure, data corresponding to 5 cell stripes CSN0 (cell-stripe number 0) through CSN4 (cell-stripe number 4) is stored in the first 256 addresses of the memory. Void space is provided immediately after the cell stripe CSN4, and data for a cell stripe CSN5 is stored at the beginning of the second 256-address area. Data corresponding to the cell stripe CSN5 through CSN9 is stored in the second 256-address area, and a similar void space is provided after the cell stripe CSN9.

After the data is stored in the shooting memory 105 as shown in FIG. 6, the data is read from the shooting memory 105 by using the high-speed page mode. In the high-speed page mode, a continuous-data-read operation is carried out for the data of the cell stripes CSN0 through CSN4 stored in the first 256-address area of the memory, and the data read from the memory is supplied to the BAA 202 via the conversion/amplification unit 106 (FIG. 4). After the continuous-data-read operation for the first 256-address area is completed, a next continuous-data-read operation for the second 256-address area is carried out based on the high-speed page mode. The border between the first 256-address area and the second 256-address area corresponds to a time when the exposure process is shifted from the cell stripe CSN4 to the cell stripe CSN5, thereby avoiding the problem of temporal stoppage of the exposure process. That is, while the beam-exposure position is shifted from CSN4 to CSN5, the data-read operation based on the high-speed page mode can be prepared for the data of CSN5 stored in the second 256-address area.

As described above, the nil-data insertion at appropriate positions into the bit-map data by the data processing unit 10 can prevent the stoppage of the data-read operation during the cell-stripe exposure.

Since the data from the data-expansion unit 122 is stored in the bit-map-data disk 104 via the data processing unit 10 prior to the start of the exposure process, the data processing by the data processing unit 10 does not restrict the speed of the exposure process. On the other hand, the data transfer to the shooting memory 105 immediately before the start of the exposure should be carried out at high speed. With regard to this matter, the void spaces as shown in FIG. 6 may be created by transferring and storing data in the shooting memory 105 by indicating each storage address. Such a method, however, makes it difficult to achieve required data-transfer speed. In the first embodiment of the present invention, a storage address in the shooting memory 105 can be incremented one by one by using a clock sent along with the processed bitmap data, so that the processed bit-map data is stored one after another.

A configuration of the data processing unit and the storage of the processed bit-map data in the shooting memory 105 will be described later in detail.

The data processing unit 10 is a buffer memory 11 having a predetermined memory volume for storing a predetermined amount of data transferred from the data-expansion unit 122. The predetermined memory volume of the buffer memory 11 is selected so as to be larger than the predetermined amount of the transferred data. Thus, even after the storage of the bit-map data in the buffer memory 11 is completed, a void space having no data therein remains in the buffer memory 11. The content of the buffer memory 11, including the bit-map data, and the nil data is transferred to the bit-map-data disk 104, so that the processed bit-map data, with the nil data inserted at an appropriate position therein is stored in the bit-map-data disk 104. The buffer memory 11 is cleared every time the data output is finished.

For one cell-stripe exposure, 16×Nucs ($\leq$50) on-and-off data are required for one aperture of the BAA 202. This data number is constant during one exposure (e.g., for one wafer), but may be changed for each set of the exposure data. Actually, a number of the shooting memories 105 are provided, and one shooting memory 105 stores the on-and-off data for four apertures belonging to the four sets (channels) $K_1$ through $K_4$ and arranged in the same column. For the two lines included in each of the four sets $K_1$ through $K_4$, the same on-and-off data can be used by delaying one data from the other.

Figure 7:
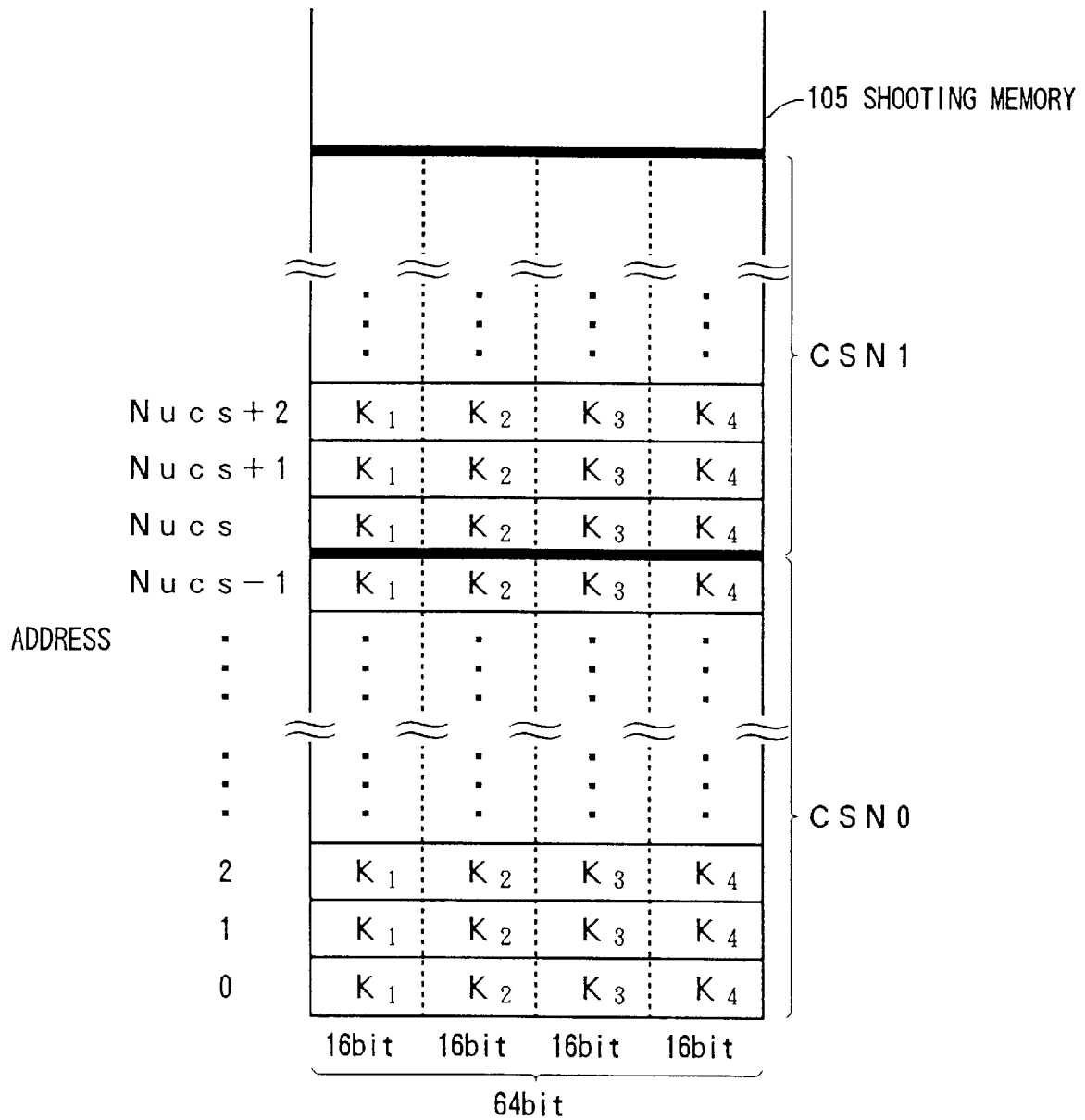
FIG. 7 is an illustrative drawing showing a data structure of the processed bit-map data stored in the shooting memory.

FIG. 7 is an illustrative drawing showing a data structure of the processed bit-map data stored in the shooting memory 105. As shown in the figure, an address of one shooting memory 105 has a 64-bit storage capacity, in which the 16-bit data (the on-and-off data for one aperture) corresponding to each of the four channels $K_1$ through $K_4$ is stored. Thus, the data required for one cell-stripe exposure occupies about 50 addresses. This number of the addresses required for the one cell-stripe exposure is denoted as Nucs. As exemplary shown in FIG. 6, one 256-address area typically stores data for 5 cell stripes.

One shooting memory 105 stores the on-and-off data for apertures arranged in the same column of the four sets $K_1$ through $K_4$, and there are 64 columns of apertures in each set, so that a set of 64 shooting memories 105 are necessary in total. In this embodiment, the set of the 64 shooting memories 105 is divided into halves, and the data transfer is carried out for each half of 32 shooting memories 105.

Accordingly, the buffer memory 11 of the data processing unit 10 needs 32 times as much memory capacity as that of 256 addresses of one shooting memory 105, where the number "32" is the number of the shooting memories 105 in one half of the set. That is, the memory capacity of the buffer memory 11 of the data processing unit 10 is calculated as:

$$256(\text{addresses}) \times 64(\text{bits}) \times 32(\text{memories}) 512\text{kbits}. \qquad (1)$$

The memory volume of the buffer memory 11 is set by a buffer-memory-volume setting unit 12 of FIG. 5.

Figure 8:
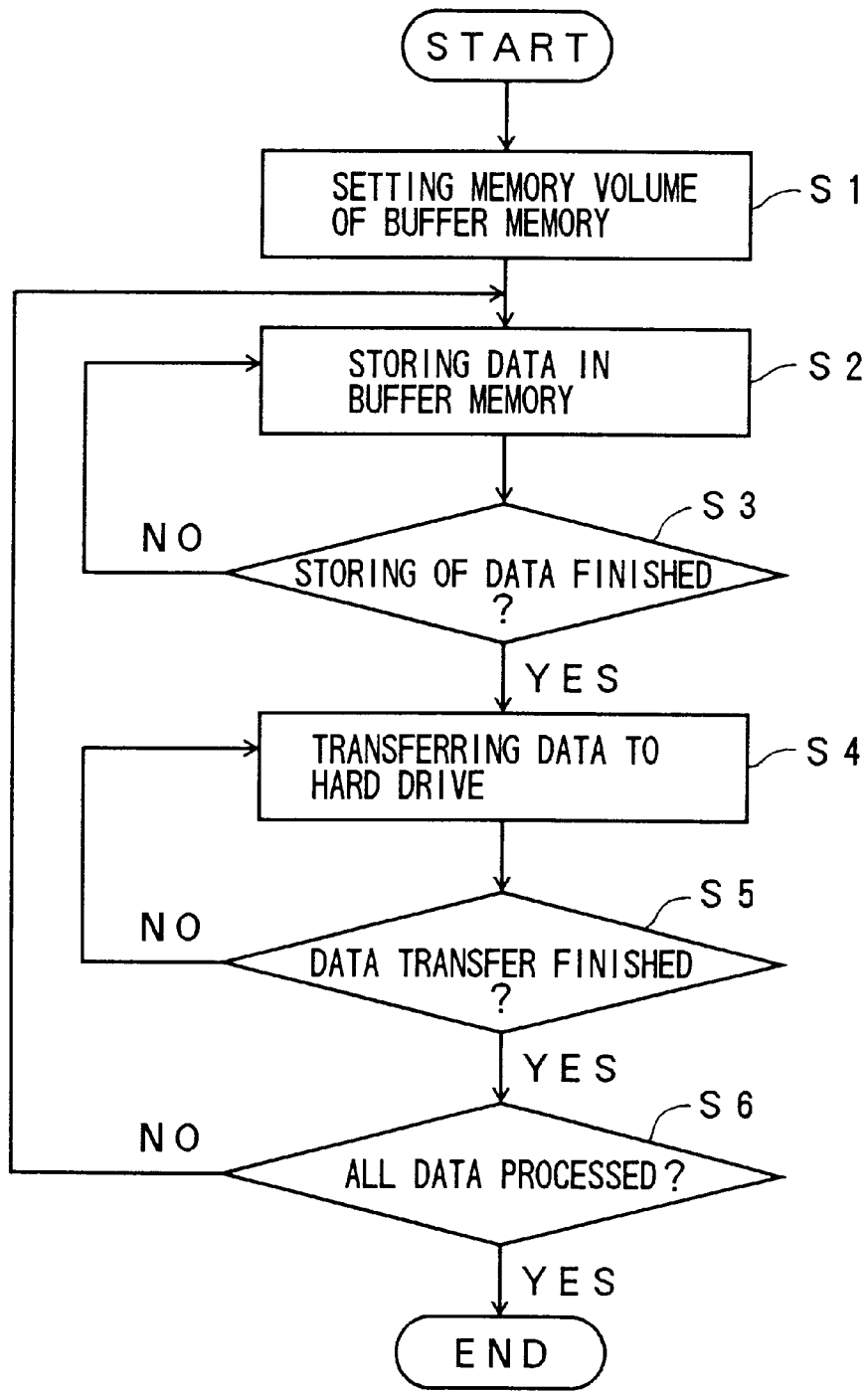
FIG. 8 is a flowchart of an operation of the buffer memory of FIG. 5.

FIG. 8 is a flowchart of an operation of the buffer memory 11.

At a step S1, the capacity of the buffer memory 11 is determined (memory capacity can be changed through a hardware change).

At a step S2, data is written (i.e., stored) in the buffer memory 11.

At a step S3, a check is made whether data for one set of data input is written in the buffer memory 11. In this case, it is checked whether data for 5 cell stripes is written in the buffer memory 11. If the answer is "no", the procedure goes back to the step S2. If the answer is "yes", the procedure goes to a step S4.

At the step S4, the data is transferred to the hard-drive storage.

At a step S5, a check is made whether all the data is transferred. If the answer is "no", the procedure goes back to the step S4. If the answer is "yes", the procedure goes to a step S6.

At a step S6, a check is made whether the above processes are carried out with respect to all the data for exposure. If data to be processed remains, the procedure goes back to the step S3. If all the data are processed, the procedure ends.

Figure 9:
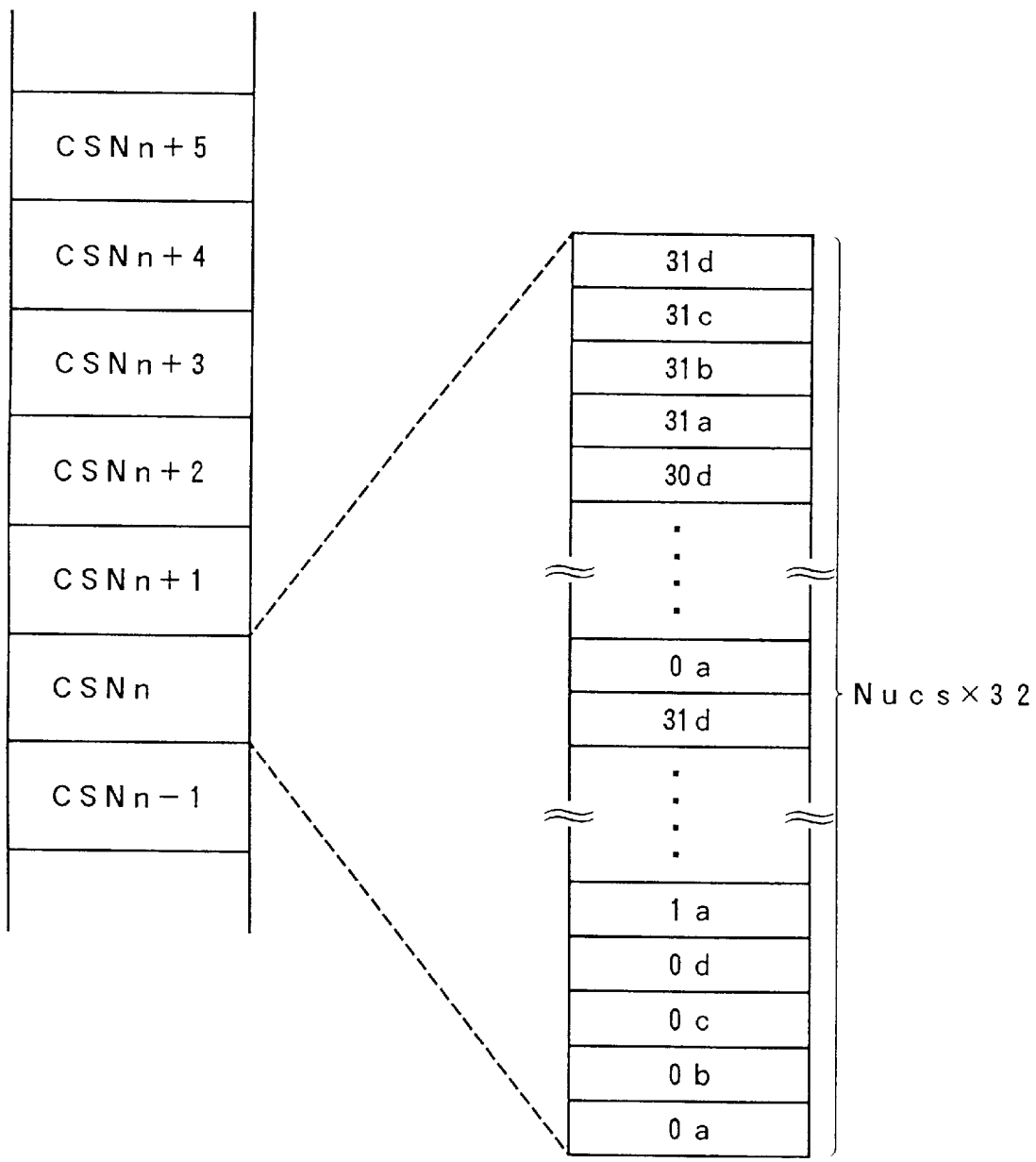
FIG. 9 is an illustrative drawing showing an order in which bit-map data is output from the data-expansion unit of FIG. 5.

FIG. 9 is an illustrative drawing showing an order in which the bit-map data is output from the data-expansion unit 122. As shown in the figure, the bit-map data for one cell stripe is output such that data for the four sets of the first column 0a, 0b, 0c, and 0d, data for the four sets of the second column 1a, 1b, 1c, and 1d, . . . , data for the four sets of the 32nd column 31a, 31b, 31c, and 31d are given in this order, and this is repeated Nucs times.

Figure 10:
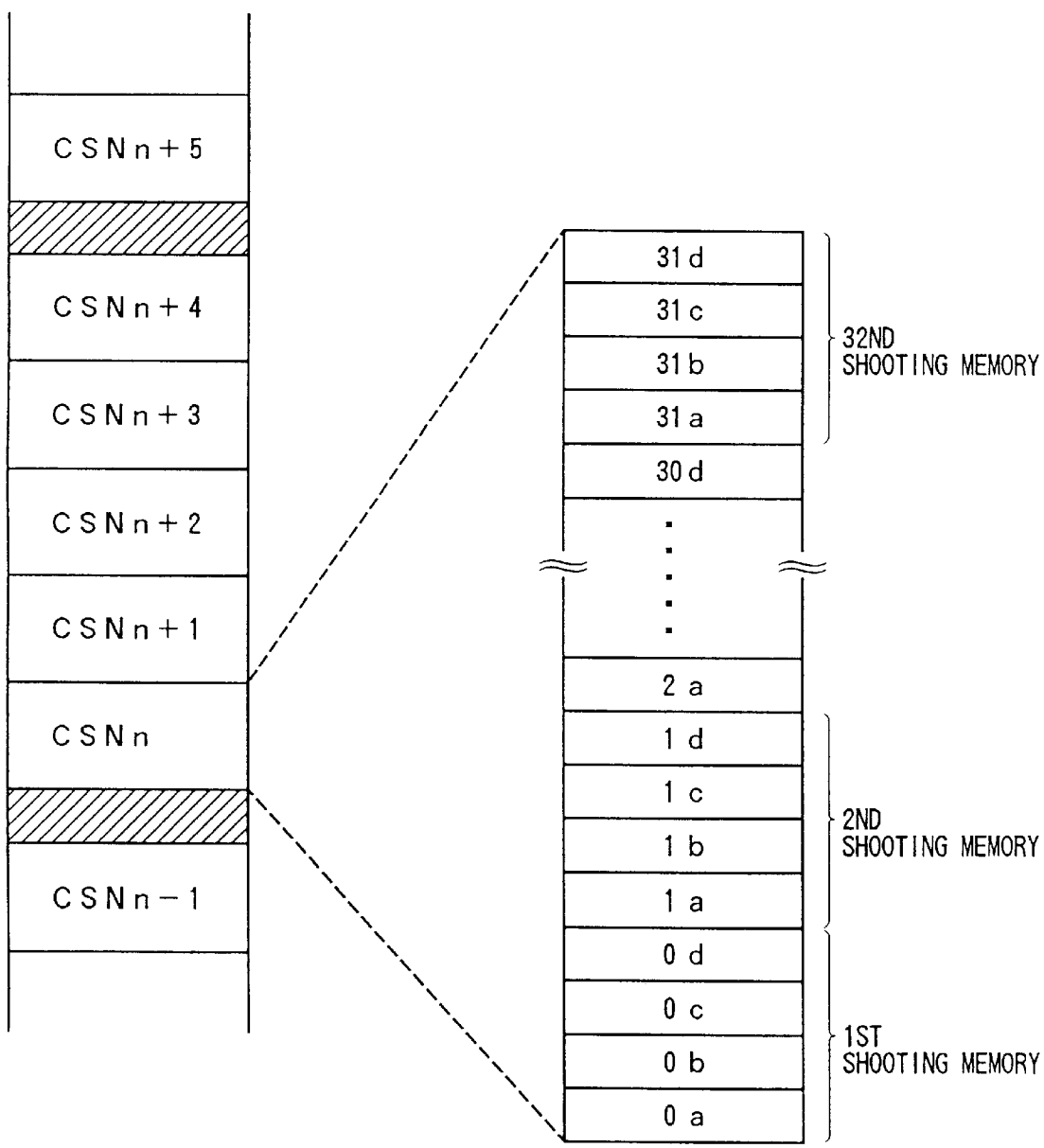
FIG. 10 is an illustrative drawing showing the processed bit-map data which is output from the buffer memory having a predetermined memory capacity.

FIG. 10 is an illustrative drawing showing the processed bit-map data which is output from the buffer memory 11 having the memory capacity defined by the equation (1). As shown in the figure, the processed bit-map data from the buffer memory 11 is inserted with the nil data at appropriate positions. The processed bit-map data is stored in the bit-map-data disk 104, and, then, is transferred to the shooting memory (memories) 105 for an exposure process. A set of the 32 shooting memories 105 store data as shown in FIG. 10.

A higher unit for data management identifies the data by the cell-stripe number CSN. In order to access data for each cell stripe in the shooting memory 105, therefore, an address conversion from a cell-stripe number CSN to a shooting-memory address becomes necessary.

By using the cell stripe number CSN and the number of addresses Nucs required for storage of one-cell-stripe data, an address ADR of the beginning of the data for a given cell stripe is represented as:

$$ADR = 256 \times INT(CSN/5) + Nucs \times (CSN \bmod 5) \qquad (2)$$

where INT(CSN/5) represents a quotient obtained by dividing CSN by 5, and (CSN mod 5) represents a residual obtained by dividing CSN by 5. Here, it is assumed that 256 addresses of one shooting memory 105 can store data for 5 cell stripes. Through an address conversion using the equation (2), data for each cell stripe stored in the shooting memory 105 is accessed by using the cell-stripe number CSN.

As described above, according to the first embodiment of the present invention, when the on-and-off data for the apertures of the BAA is stored in the high-speed storage device (shooting memory) in the BAA-type charged-particle-beam exposure device, the buffer memory having the predetermined memory capacity is used to insert the void spaces into the bit-map data. In this manner, data for each cell stripe is read from the storage device without a break in the high-speed page mode.

Figure 11:
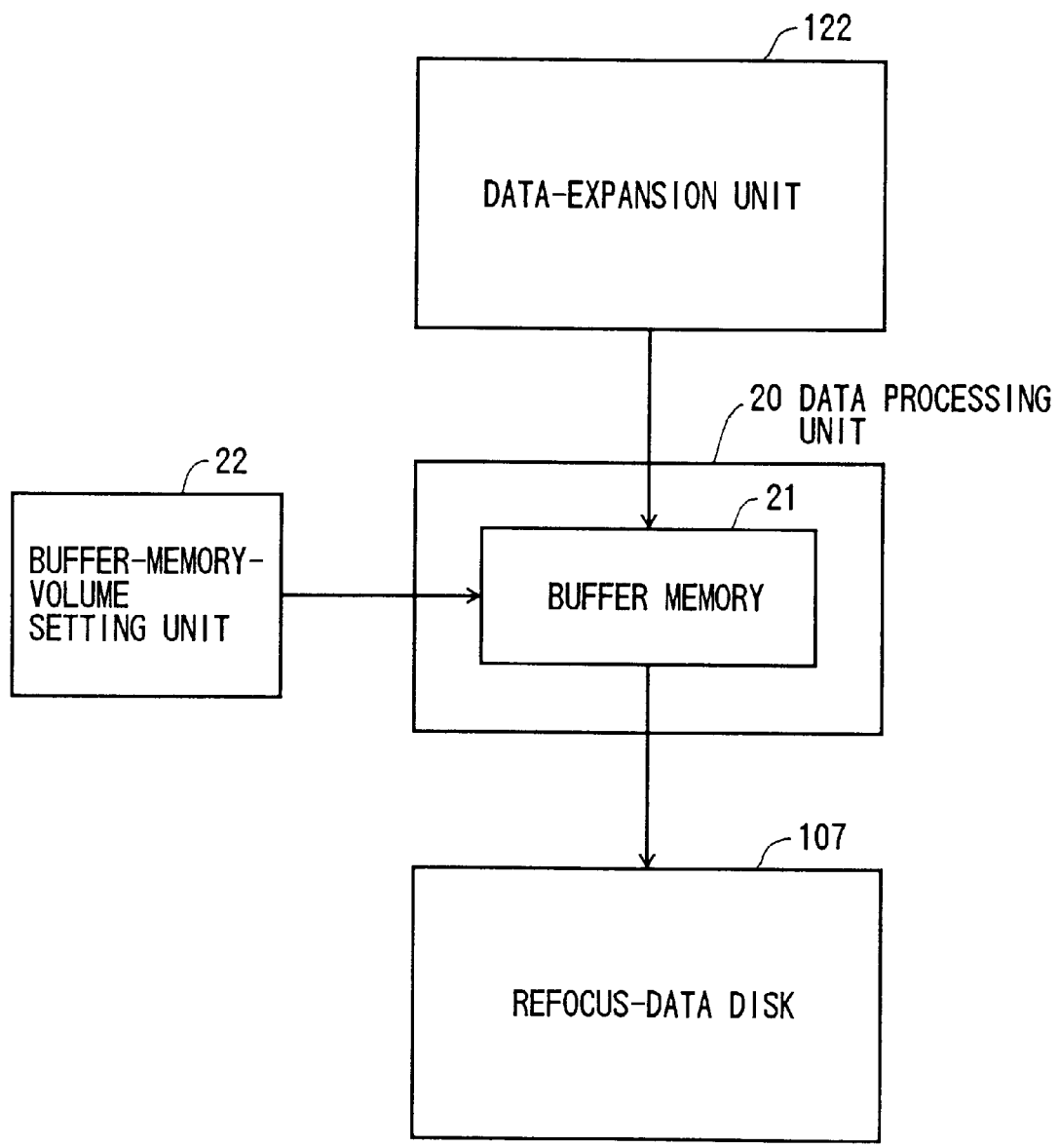
FIG. 11 is a block diagram showing a data processing unit according to a second embodiment of the present invention.

FIG. 11 is a block diagram showing a data processing unit 20 according to a second embodiment of the present invention. In the second embodiment, the data processing unit 20, similarly to the data processing unit 10 of FIG. 5 is provided in the data-transfer path of the refocus data.

The refocus memory 108 of FIG. 4 also requires a high-speed-data-read capacity. To meet this demand in the second embodiment, one address of the refocus memory 108 has a 1024-bit storage capacity. By allocating a large storage capacity to each address in this manner, a high-speed-data-read operation can be achieved without using the high-speed page mode as in the first embodiment.

Despite there being no need for the high-speed page mode, void spaces should be inserted into the refocus data as in the first embodiment. This is because continuous data writing will result in cell-stripe data stored in a given address being directly followed by next-cell-stripe data written in the same address. If the data is stored in this manner, it is impossible to access data for each cell stripe, based on the cell-stripe number CSN.

In the second embodiment, therefore, the data processing unit 20 inserts nil data into the refocus data after each cell stripe.

The data processing unit 20 inserts the nil data at appropriate positions into the refocus data generated by the data-expansion unit 122, and store the processed refocus data in the refocus-data disk 107. The processed refocus data is continuously read from the refocus-data disk 107 to be stored in the refocus memory 108. Since the processed refocus data is inserted with the nil data at the appropriate positions, storage of cell-stripe data with the beginning of the data starting at a midpoint of an address can be avoided.

Figure 12:
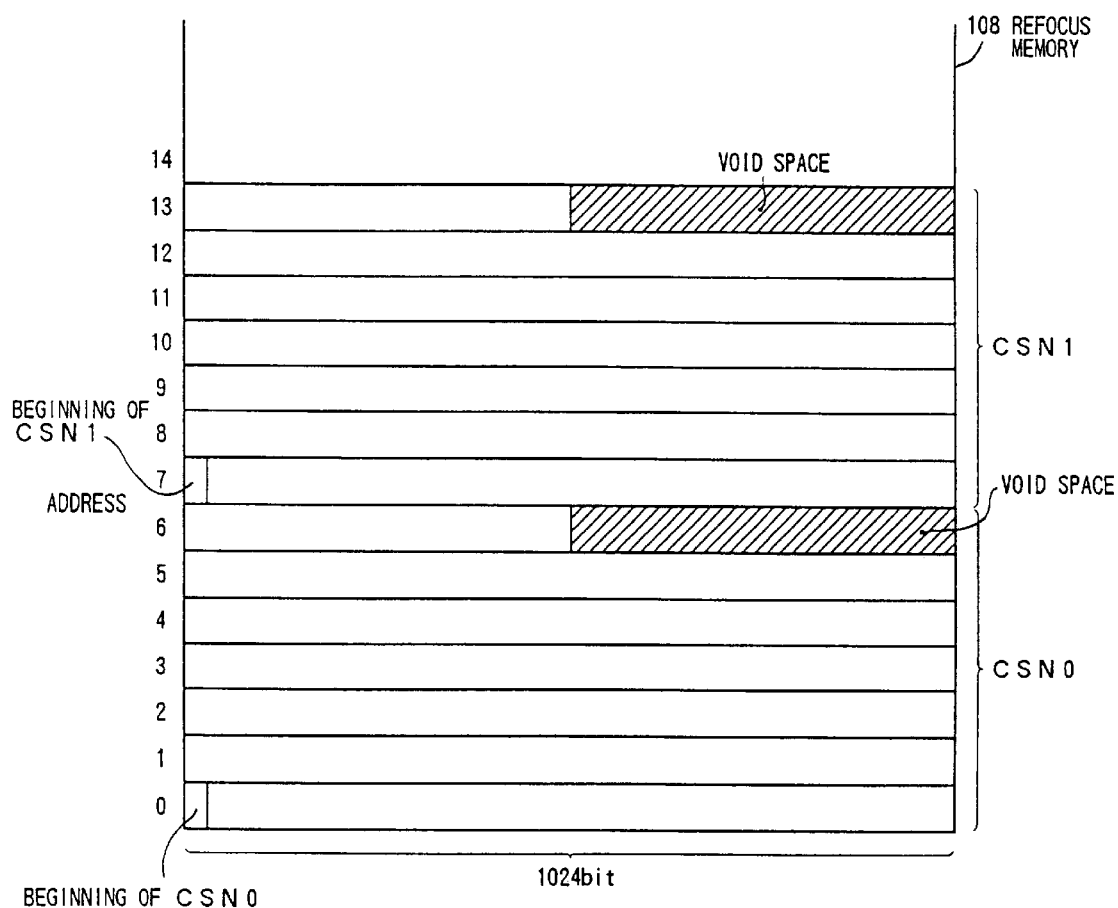
FIG. 12 is an illustrative drawing showing a memory space of the refocus memory of FIG. 4 storing refocus data inserted with the nil data according to the second embodiment of the present invention.

FIG. 12 is an illustrative drawing showing a memory space of the refocus memory 108 storing the refocus data inserted with the nil data. As shown in the figure, void spaces are inserted at appropriate positions so that the beginning of each cell stripe starts at the beginning of an address.

A size of a buffer memory 21 of the data processing unit 20 is determined as follows. The amount of the refocus data for one cell stripe is 8 bit×16×Nucs. Since Nucs is less than about 50, the refocus data for one cell stripe is no more than about 6400 bits. Since one address of the refocus memory 108 stores 1024 bits, 7 addresses are required to store the refocus data for one cell stripe. Thus, the size of the buffer memory 21 of the data processing unit 20 is represented as:

$$7 \times 1024 \text{(bits)} = 7168 \text{(bits)} \quad (3)$$

The size of the buffer memory 21 is set by a buffer-memory-volume setting unit 22.

A conversion from a cell-stripe number CSN to an address in the refocus memory 108 is given by:

$$ADR = 7 \times CSN \quad (4)$$

Through the address conversion using the equation (4), data stored in the refocus memory 108 is accessed for each cell stripe by using the cell-stripe number CSN.

As described above, according to the second embodiment of the present invention, when the refocus data is stored in the high-speed storage device (refocus memory) in the BAA-type charged-particle-beam exposure device, the buffer memory having the predetermined memory capacity is used to insert the void spaces into the refocus data. In this manner, the beginning of each cell stripe is located at the beginning of an address, so that the data for each cell stripe can be accessed and read from the storage device by using the cell-stripe number CSN.

As described above, according to the present invention, data storage positions are adjusted by data-position-adjustment data such that a continuous-data-read operation is achieved for one continuous exposure process. Therefore, the data-read operation is prevented from being stopped during an exposure process for one cell stripe.

Also, according to the present invention, the data, inserted with the data-position-adjustment data, is generated prior to the start of the exposure process and is transferred to a high-speed memory at the start of the exposure process. Therefore, the process of inserting the data-position-adjustment data does not slow down the speed of the data transfer to the high-speed memory, so that throughput of the exposure process is not reduced.

Further, according to the present invention, the data-position-adjustment data is inserted into the data at predetermined intervals. Therefore, the exposure process for each cell stripe is carried out without a break in the data-read operation.

Also, according to the present invention, the buffer having the predetermined memory volume is used for inserting the data-position-adjustment data into the data at the predetermined intervals. Therefore, the insertion of the data-position-adjustment data is easily carried out.

In addition, according to the present invention, the buffer is reset every time before the data storing begins. Therefore, nil data is inserted as the data-position-adjustment data.

According to the present invention, a predetermined amount of the data stored in the buffer can be changed for each exposure data. Therefore, it is possible to cope with exposure processes having different data amounts.

Also, according to the present invention, the data inserted with the data-position-adjustment data is stored one after another in the high-speed memory by counting up a storage address through a predetermined clock. Therefore, the data inserted with the data-position-adjustment data is stored in the shooting memory at high speed.

Further, according to the present invention, storage positions of data are adjusted by the data-position-adjustment data such that the data is stored in a memory area starting at the beginning of a given address of the data storage unit (refocus memory). Therefore, the reading of the refocus data for each cell stripe is easily carried out during the exposure process.

Further, the present invention is not limited to these embodiments, but various variations and modifications may be made without departing from the scope of the present invention.

What is claimed is:

1. A device exposing a wafer to charged-particle beams in an exposure process by generating a plurality of micro beams and controlling deflection of each of said micro beams relative to whether said micro beams reach said wafer, said device comprising:

a data processing unit inserting data-position-adjustment data into control data for controlling said deflection; and a first data-storage unit storing said control data, inserted with said data-position-adjustment data, and outputting said control data at a time of said exposure process, wherein storage positions of said control data in said first data-storage unit are adjusted by said data-position-adjustment data so that said control data can be continuously read from said first data-storage unit, enabling said exposure process to be continuous.

2. The device as claimed in claim 1, further comprising a second data-storage unit storing said control data, inserted with said data-position-adjustment data, said control data, inserted with said data-position-adjustment data, being stored by said data processing unit in said second data-storage unit prior to a start of said exposure process and being transferred from said second data-storage unit to said first data-storage unit at said start of said exposure process.

3. The device as claimed in claim 1, wherein said data processing unit inserts said data-position-adjustment data into said control data at predetermined intervals.

4. The device as claimed in claim 3, wherein said data processing unit comprises a buffer having a predetermined storage volume and storing a predetermined amount of said control data which is less than said predetermined storage volume and outputs all contents of said buffer including said predetermined amount of said control data and a remnant part, of the predetermined storage volume, of said buffer, so that said data-position-adjustment data is inserted into said control data at said predetermined intervals.

5. The device as claimed in claim 4, wherein said buffer is reset every time and in advance of said control data being stored therein.

6. The device as claimed in claim 4, wherein said predetermined amount of said control data varies for each different said control data.

7. The device as claimed in claim 1, wherein said first data-storage unit consecutively stores said control data, inserted with said data-position-adjustment data, by counting up a storage address thereof through a predetermined clock.

8. A process of exposing a wafer to charged-particle beams in an exposure process by generating a plurality of micro beams and controlling deflection of each of said micro beams relative to whether said micro beams reach said wafer, said method comprising the steps of:

a) inserting data-position-adjustment data into control data for controlling said deflection;

b) storing said control data, inserted with said data-position-adjustment data, in a first memory; and c) reading said control data from said first memory at a time of said exposure process, wherein storage positions of said control data in said first memory are adjusted by said data-position-adjustment data so that said control data can be continuously read from said first memory, enabling said exposure process to be continuous.

9. The method as claimed in claim 8, further comprising a step:

d) of storing said control data, inserted with said data-position-adjustment data, in a second memory prior to a start of said exposure process; and said step b) further comprises transferring said control data, inserted with said data-position-adjustment data, from said second memory to said first memory at said start of said exposure process.

10. The method as claimed in claim 8, wherein said step a) further comprises inserting said data-position-adjustment data into said control data at predetermined intervals.

11. The method as claimed in claim 10, wherein said step a) further comprises the steps of:

a1) storing, in a buffer, a predetermined amount of said control data, said buffer having a predetermined storage volume and said predetermined amount being less than said predetermined storage volume; and a2) outputting all contents of said buffer including said predetermined amount of said data and a remnant part, of the predetermined storage volume, of said buffer.

12. The method as claimed in claim 11, wherein said step a) further comprises resetting said buffer every time and in advance of said control data being stored therein.

13. The method as claimed in claim 11, wherein said predetermined amount of sad control data varies for each different said control data.

14. The method as claimed in claim 8, wherein said step b) consecutively stores said control data, inserted with said data-position-adjustment data, in said first memory by counting up successive storage addresses of said first memory through a predetermined clock.

15. A device exposing a wafer to charged-particle beams in an exposure process by generating a plurality of micro beams and controlling focussing of each of said micro beams on said wafer, said device comprising:

a data processing unit inserting data-position-adjustment data into control data for controlling said focussing; and a first data-storage unit storing said control data, inserted with said data-position-adjustment data, and outputting said control data at a time of said exposure process, wherein storage positions of said control data in said first data-storage unit are adjusted by said data-position-adjustment data so that each start of said control data corresponds to a beginning of an address in said first data-storage unit.

16. The device as claimed in claim 15, further comprising a second data-storage unit storing said control data, inserted with said data-position-adjustment data, wherein said control data, inserted with said data-position-adjustment data, is stored by said data processing unit in said second data-storage unit prior to a start of said exposure process and is transferred from said second data-storage unit to said first data-storage unit at said start of said exposure process.

17. An electron lithography device employing a blanking-aperture-array through which microbeams are selectively passed, in accordance with control data, for exposing a wafer, said device comprising:

a data processing unit processing the control data by inserting data-position-adjustment data into the control data and outputting the processed control data to a first data storage unit; and a control unit, for each exposure, continuously reading the respective, processed control data from the first data storage unit.

18. The device as claimed in claim 17, further comprising a second data-storage unit storing said processed control data output by said data processing unit prior to a start of an exposure process and said data processing unit transferring the respective processed data for each exposure from the second data-storage unit and to the first data-storage unit at the start of the exposure of a wafer.

19. A method of electron lithography employing a blanking-aperture-array through which microbeams are selectively passed, in accordance with control data, for exposing a wafer, said method comprising:

processing the control data by inserting data-position-adjustment data into the control data and storing the processed control data in a first data-storage unit; and for each exposure, continuously reading the respective, processed control data from the first data storage unit.

20. The method as claimed in claim 19, further comprising storing said processed control data in a second data-storage unit and, prior to a start of each exposure, transferring the respective processed data for the exposure from the second and to the first data-storage unit.

* * * * *

UNITED STATES PATENT AND TRADEMARK OFFICE
CERTIFICATE OF CORRECTION

PATENT NO.: 6,072,185
DATED : June 6, 2000
INVENTOR(S): Soichiro ARAI et al.

It is certified that error appears in the above-identified patent and that said Letters Patent is hereby corrected as shown below:

Col. 12, line 5, change "sad" to --said--.

Signed and Sealed this

Twenty-seventh Day of March, 2001

Attest:

NICHOLAS P. GODICI

Attesting Officer

Acting Director of the United States Patent and Trademark Office